United States Patent [19]
Pio et al.

[11] Patent Number: 6,128,219
[45] Date of Patent: Oct. 3, 2000

[54] NONVOLATILE MEMORY TEST STRUCTURE AND NONVOLATILE MEMORY RELIABILITY TEST METHOD

[75] Inventors: Federico Pio, Brugherio; Enrico Gomiero, Padua; Alberto Modelli, Milan; Paola Paruzzi, Robbiate, all of Italy

[73] Assignee: STMicroelectronics, S.r.l., Agrate Brianza, Italy

[21] Appl. No.: 09/428,683

[22] Filed: Oct. 27, 1999

[51] Int. Cl.[7] .................................................. G11C 16/06
[52] U.S. Cl. .............................. 365/185.09; 365/185.05; 365/185.24; 365/201
[58] Field of Search ......................... 365/185.05, 185.09, 365/185.23, 185.24, 185.33, 201

[56] References Cited

U.S. PATENT DOCUMENTS

| | | | |
|---|---|---|---|
| 5,515,318 | 5/1996 | Cappelletti et al. | 365/185.09 |
| 5,604,699 | 2/1997 | Cappelletti et al. | 365/185.09 |
| 5,712,816 | 1/1998 | Cappelletti et al. | 365/185.05 |
| 5,761,125 | 6/1998 | Himeno | 365/185.24 |
| 5,774,395 | 6/1998 | Richart et al. | 365/185.2 |
| 5,793,675 | 8/1998 | Cappelletti et al. | 365/185.09 |
| 5,909,397 | 6/1999 | San et al. | 365/185.24 |

*Primary Examiner*—Son Mai
*Attorney, Agent, or Firm*—Theodore E. Galanthay; Robert Iannucci; Seed IP Law Group PLLC

[57] ABSTRACT

A test structure is formed by an array of memory cells connected in parallel and including each a memory transistor and a select transistor connected in series. The gate terminals of the select transistors of all memory cells are biased to a value next to the threshold voltage of the select transistors. Therefore, in each memory cell, the drain current is limited by the memory transistor for control gate voltages below the threshold voltage of the memory transistor, and by the select transistor at higher voltages; for high control gate voltages, the drain current is clamped to a constant maximum value. Since the clamping effect of the select transistors acts on each memory cell, the total maximum current of the test structure may be held below a value causing a limitation in the current generated by the entire array because of the resistance in series to the output of the test structure. Thus also the right side of the threshold distribution may be evaluated and the presence of defective cells causing injection of electrons in the floating gate of the memory transistors may be detected.

29 Claims, 15 Drawing Sheets

NONVOLATILE MEMORY TEST STRUCTURE AND NONVOLATILE MEMORY RELIABILITY TEST METHOD

TECHNICAL FIELD

The present invention relates to a nonvolatile memory test structure and to a nonvolatile memory test method.

BACKGROUND OF THE INVENTION

As known, the requirements posed to the gate and/or tunnel oxides are becoming stricter and stricter with the increase of the integration level; therefore the availability of methods for evaluating the oxide reliability is very important.

A main problem in nonvolatile EEPROM and flash-EEPROM devices resides in the difficulty of measuring the distribution of the threshold voltage of memory cells, both at the end of the manufacturing process (so as to obtain an index of the fluctuations in the manufacture) and after cycling (so as to have an index of the lack of uniformity of the memory device degrade).

In particular, a reliable method for precisely measuring the threshold voltage distribution is very useful during debugging and may become very important also for qualifying the new products.

The reliability of the tunnel oxide may be measured through very simple structures, such as capacitors, using different techniques (e.g., constant current stress or linear ramp voltage stress, exponential ramp current stress). The obtainable information is however not always indicative of the real structure, since the cell geometry is substantially different from the capacitor geometry.

Presently, the cell threshold may be obtained only when the device is operating, that is at a very late design and manufacture stage.

Furthermore, U.S. Pat. Nos. 5,515,318, 5,604,699, 5,712,816 and 5,793,675 disclose a test structure and method for measuring the tail of the threshold distribution at low voltage with high precision (so as to detect even a single defective cell) for flash-FEPROM devices. The test structure has all bit lines connected in parallel to a single drain pad (all the drains of the cells are connected to each other), all the word lines connected in parallel to a single control gate pad (all the control gates are connected to each other); furthermore also the sources are connected together. Thereby, the threshold of all the cells may be read in parallel; in particular, comparing the threshold distributions obtained before and after applying a stress, it is possible to point out the shift of the tail due to a single defective cell.

This structure does not allow the measurement of the whole distribution. Indeed, the increase of the control gate voltage causes an increase in the read current (which is the sum of the current of the single cells, which are gradually turning on); however the increase of the current is limited by the resistance in series to the circuit and by the distributed resistance of the circuit. Thus the structure becomes progressively less sensitive with the increase of the cells having a threshold voltage lower to a given control gate voltage.

Another limitation of the known structure is that it is not possible to program the entire array under the working conditions of the device. Programming an entire array of flash-EEPROM cells would indeed require a high channel current for generating hot electrons, and the above cited current limitation prevents the required current values to be reached.

SUMMARY OF THE INVENTION

An embodiment of the present invention provides a test structure and method overcoming the above limitations. The test structure and method allow measuring of the entire threshold distribution of the test device and evaluating the quality of the tunnel and interpoly oxide following injection of electrons into the floating gate from the substrate or from the control gate.

BRIEF DESCRIPTION OF THE DRAWINGS

For a better understanding of the present invention, embodiments thereof are now described, purely by way of non-limiting example, with reference to the attached drawings.

FIG. 2a shows a circuit diagram of a cell of the test device of FIG. 1a.

FIG. 2b is a cross-section of the cell of FIG. 2a.

FIG. 4 shows the plot of the drain current versus control gate voltage and the respective transconductance for the cell of FIG. 2a.

FIG. 5 shows the plot of the drain current versus control gate voltage for different biasing conditions of the array of FIG. 1a.

FIG. 6 shows normalized plots of the transconductance versus control gate voltage for different biasing conditions of the cell of FIG. 2a.

FIG. 7 shows a normalized plot of the drain current versus control gate voltage for different biasing conditions of the cell of FIG. 2a.

FIG. 9b shows plots of the transconductance obtained from the drain current versus control gate voltage plots of FIG. 9a.

FIG. 10b shows plots of the transconductance obtained from the drain current versus control gate voltage plots of FIG. 10a.

DETAILED DESCRIPTION OF THE INVENTION

Figure 1A:
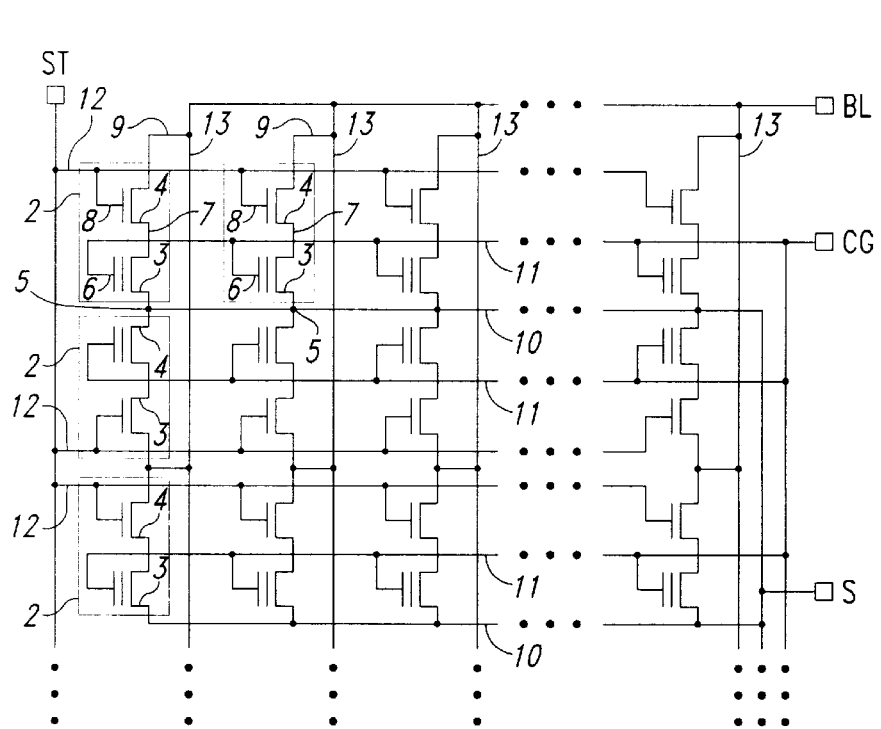
FIG. 1a is a circuit diagram of a first embodiment of a test device according to the invention.

FIG. 1a shows a test structure 1 formed in a wafer of semiconductor material housing a plurality of memory devices (of which only test structure 1 is shown) before dice separation. Test structure 1 is formed by an array of memory cells 2; each memory cell 2 is formed by a memory transistor 3 and by a select transistor 4 connected in series. The memory transistors 3 of the memory cells 2 have source terminals 5 connected together and to a source pad S through source lines 10; control gate terminals 6 connected together and to a control gate pad CG through control gate lines 11; and drain terminals 7 connected to source terminals of the respective select transistors 3. The select transistors 3 of the memory cells 2 have gate terminals 8 connected together and to a select transistor pad ST through select gate lines 12 and drain terminals connected together and to a bit line pad BL through bit lines 13.

Figure 1B:
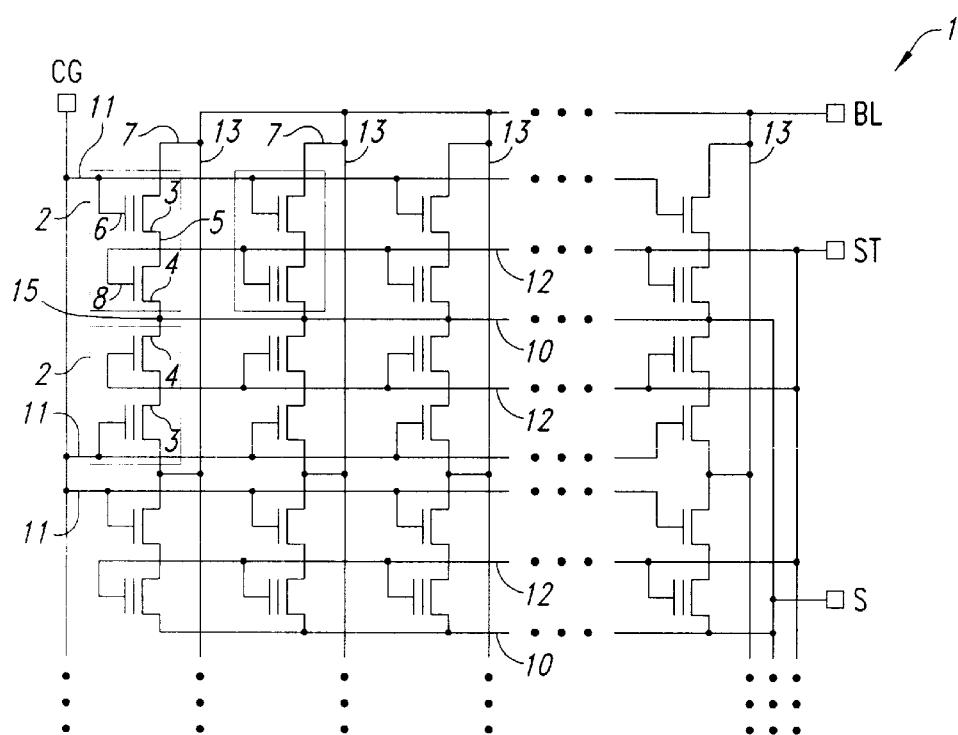
FIG. 1b is a circuit diagram of a second embodiment of a test device according to the invention.

In the embodiment of FIG. 1b, the select transistor 4 of each memory cell 2 is connected to the source terminal 5 of the respective memory transistor 3, instead of the drain terminal 7, as in FIG. 1. Therefore, the memory transistors 3 have drain terminals 7 connected together and to the bit line pad BL through the bit lines 13; control gate terminals 6 connected together and to the control gate pad CG through control gate lines 11 and source terminals 5 connected to drain terminals of the respective select transistors 4. The select transistors 4 have gate terminals 8 connected together and to the select transistor pad ST through select gate lines 12 and source terminals 15 connected together and to the source pad S through the source lines 10.

Figure 1C:
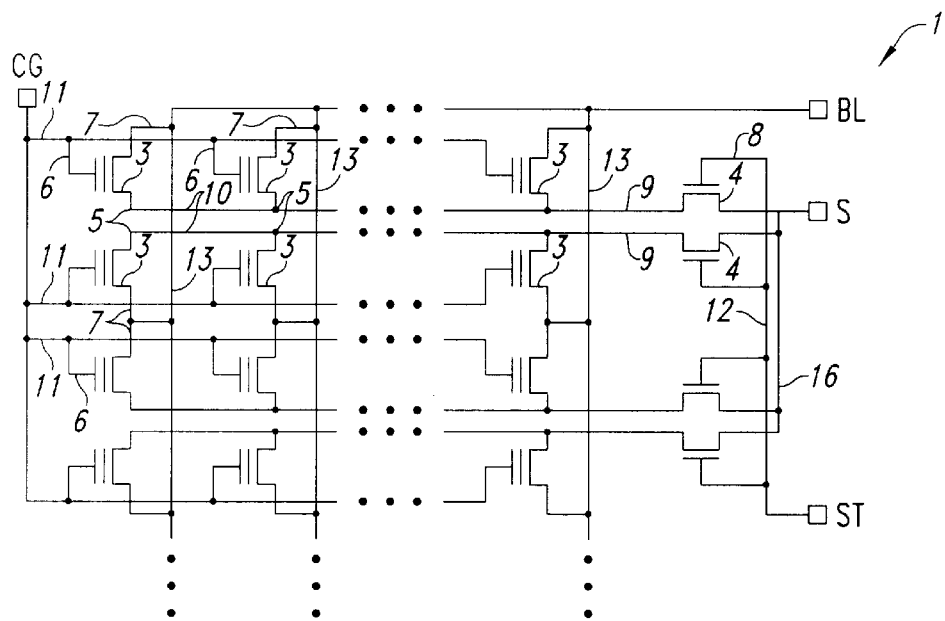
FIG. 1c is a circuit diagram of a third embodiment of a test device according to the invention.

In the embodiment of FIG. 1c, a group of memory transistors 3 (for example eight or sixteen memory transistors 3 forming a byte) is connected to a same select transistor 4 arranged between the source terminal 5 of the respective memory transistors 3 and the source pad S. Here, the memory transistors 3 have drain terminals 7 connected together and to the bit line pad BL through the bit lines 13; control gate terminals 6 connected together and to the control gate pad CG through control gate lines 11 and source terminals 5 connected together and to the source lines 10. Each source line 10 is connected to the drain terminal 9 of the respective select transistors 4. The select transistors 4 have gate terminals 8 connected together and to the select transistor pad ST through a single select line 12 and source terminals connected together and to the source pad S through an output line 16. Of course, in case of further groups of memory transistor 3 arranged on a same row and connected to own select transistors 4, further select lines 12 are provided, al connected to the select transistor pad ST. In practice, in the embodiment of FIG. 1c, each select transistor 4 is shared by a group of memory cells (not expressly referenced in FIG. 1c).

The test structure 1 of FIGS. 1a, 1b, 1c is manufactured simultaneously and using the same technology of memory devices (not shown) housed in the same wafer, and is tested to determine the electrical characteristics of the memory devices, analogously to the above cited U.S. patents.

According to an aspect of the invention, the gate terminals 8 of the select transistors 4 of all memory cells 2 are biased to a value next to the threshold voltage of the select transistor 4, so as to limit the maximum current flowing in the memory transistors 3, as explained hereinbelow for a memory cell 2 of the type shown in FIG. 1a. The following explanation also applies to the embodiments of FIGS. 1b, 1c.

Figures 2A, 2B:
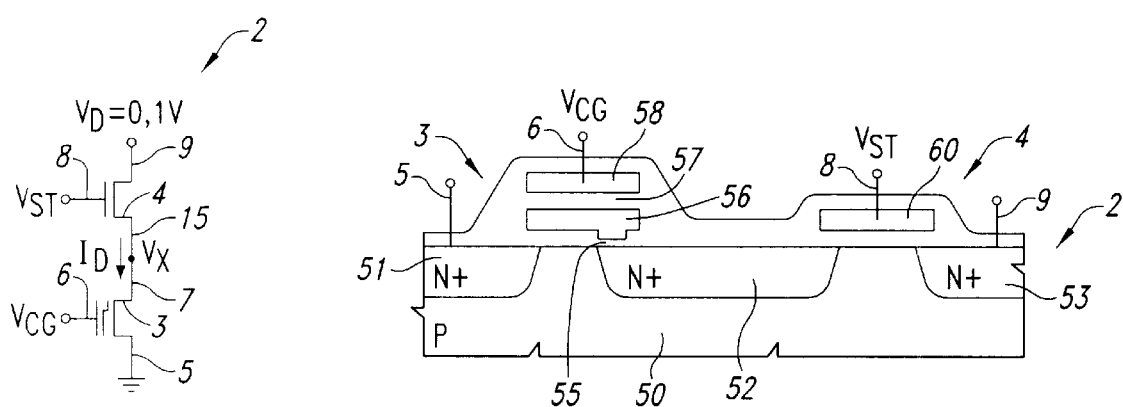

For a better comprehension, FIG. 2a shows the electrical diagram of a cell 2 of the test device 1 of FIG. 1a and the electrical quantities discussed hereinafter. Here. $V_D$ is a drain voltage present at drain terminal 9 of the select transistor 4; $V_{ST}$ is a select voltage applied to the gate terminal of select transistor 4; $V_X$ is a voltage on drain terminal 7 of the memory transistor 3; $V_{CG}$ is a control gate voltage of the memory transistor 3; and the source terminal of the memory transistor 3 is grounded. Furthermore, $I_D$ is a drain current flowing in the memory cell 2.

FIG. 2b shows a cross-section of the memory cell 2, depicting schematically the actual implementation of memory cell 2. In particular, memory cell 2 is integrated in a substrate 50, e.g., of P-type, housing a first $N^+$-type region 51 forming a source region of the memory transistor 3, connected to source terminal 5; a second $N^+$-type region 52 forming a drain region of the memory transistor 3 and a source region of the select transistor 4; and a third $N^+$-type region 53 forming a drain region of the select transistor 4, connected to drain terminal 9. Memory transistor 3 also includes a tunnel oxide region 55, a floating gate region 56, an interpoly dielectric region 57 and a control gate region 58, in a per se known manner. Control gate region 58 is biased at control gate voltage $V_{CG}$. Select transistor 4 also includes a gate region 60 biased at select voltage $V_{ST}$.

Figure 3:
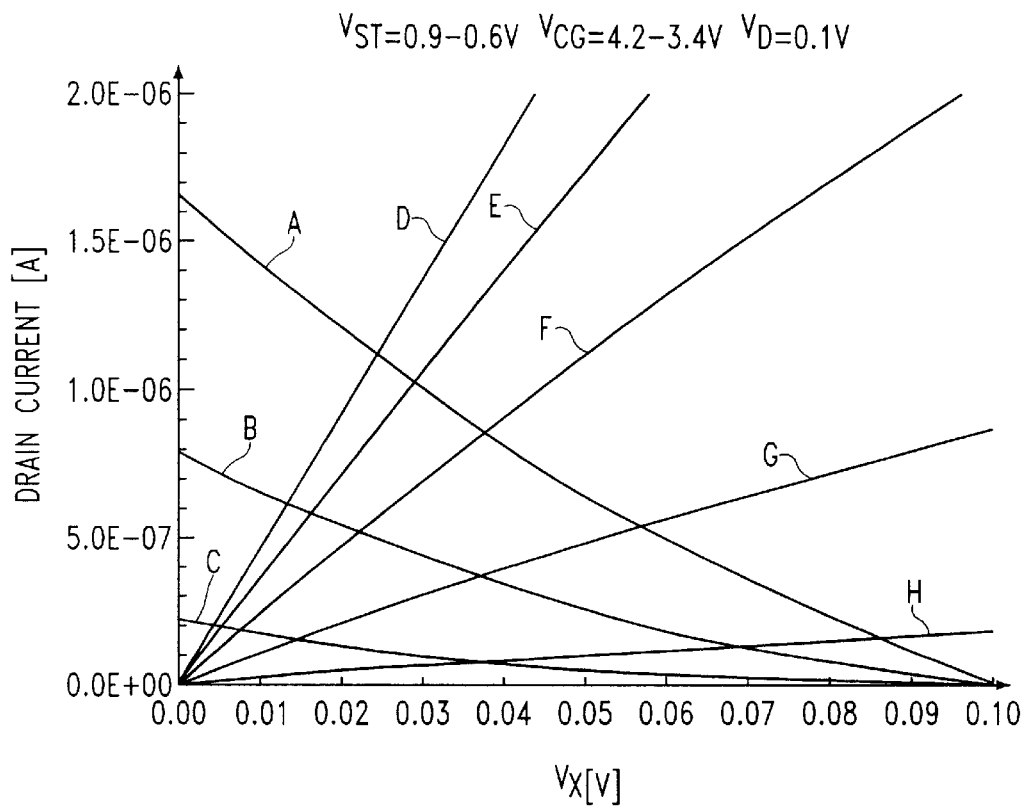
FIG. 3 is a plot of the current versus voltage for the cell of FIG. 2a for determining the point of work.

In a test condition of the test structure, the gate terminal 8 of the select transistor 4 of each memory cell 2 is biased at a voltage slightly higher than the threshold voltage of the select transistor 4. The obtained point of work of each memory cell 2 may be determined experimentally from the plots of FIG. 3, showing load characteristics of the select transistor 4 (curves A, B, C) and output characteristics of the memory transistor 3 (curves D, F, F, G, H), i.e., drain current $I_D$ versus intermediate voltage $V_X$ (voltage on drain terminal 7 of the memory transistor 3) for preset values of the select voltage $V_{ST}$ applied to the gate terminal of the select transistor 4 and for preset values of the control gate voltage $V_{CG}$ of the memory transistor 3, with the drain terminal 9 of the select transistor 4 held at a constant voltage (in the example $V_D$=0.1 V). In particular, curve A is the load characteristic of the select transistor 4 at $V_{ST}$=0.9 V, curve 13 is obtained at $V_{ST}$=0.75 V and curve C is obtained at $V_{ST}$=0.6 V; curve D is the output characteristic of the memory transistor 3 at $V_{CG}$=4.2 V, curve E is obtained at $V_{CG}$=4.0 V, curve F is obtained at $V_{CG}$=3.8 V, curve G is obtained at $V_{CG}$=3.6 V, and curve H is obtained at $V_{CG}$=3.4 V.

Figure 4:
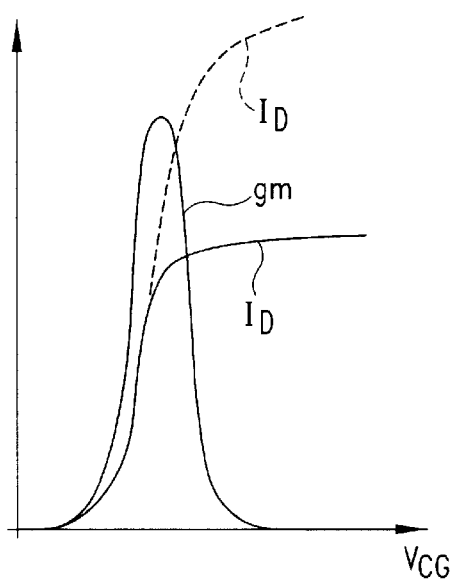

From the plots of FIG. 3, it is clear that, in each memory cell 2, the drain current $I_D$ is limited by the memory transistor 3 at control gate voltages $V_{CG}$ below the threshold voltage of the memory transistor 3, and by the select transistor 4 at higher voltages. For high control gate voltages $V_{CG}$, the drain current $I_D$ is clamped to a constant maximum value $I_{SAT}$, as shown in FIG. 4 by a continuous line; correspondingly, the transconductance $g_m$=$dI_D/dV_{CG}$ increases sharply up to a maximum value and then returns to zero according to a bell shape. FIG. 4 also shows, in dashed lines, the plot of the drain current $I_D$ for a memory transistor 3 of the same type, without current limitation by the select transistor 4 (select voltage $V_{ST}$ well beyond the threshold voltage of the select transistor 4).

Since the clamping effect of the select transistors 4 acts on each memory cell 2, the total maximum current of the test structure 1 is reduced with respect to the case of the prior art test structure. Thus any series resistance problem is reliably avoided.

Figure 5:
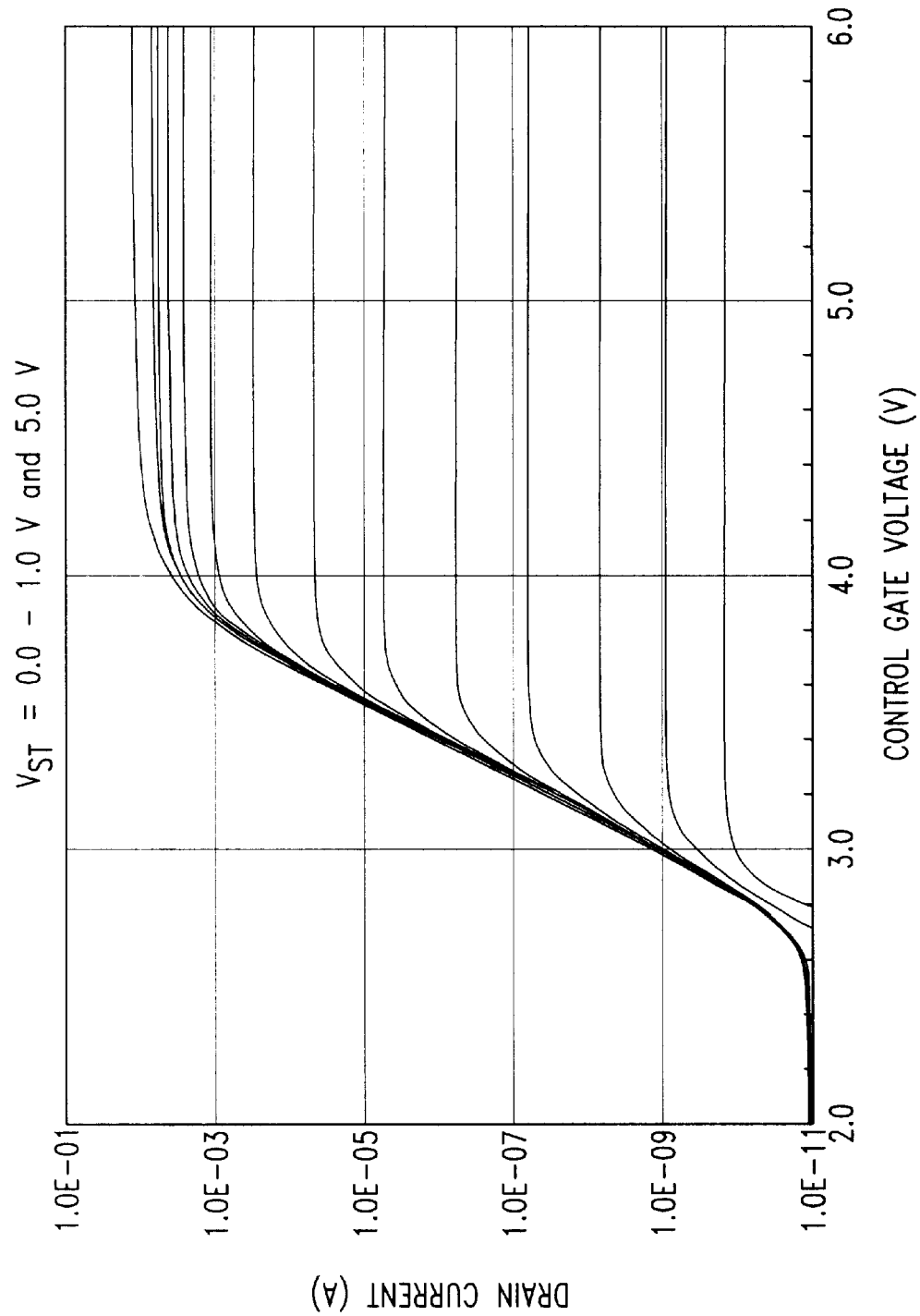

As shown in FIG. 5, showing plots of the drain current $I_D$ versus control gate voltage $V_{CG}$ for different select voltages $V_{ST}$, the drain current $I_D$ has a step, the center point whereof occurs at a value $V_{Teff}$ of control gate voltage $V_{CG}$:

$$V_{CG}=V_{Teff}=V_T-V_0$$

wherein $V_T$ is the threshold voltage (extrapolated in linear zone) of the memory transistor 3 and $V_0$ is a term increasing along with a reduction of the select voltage $V_{ST}$. Indeed, the lower is the select voltage $V_{ST}$ applied to the select transistor 4, the lower is the effective threshold voltage $V_{Teff}$ and the earlier is the instant at which the clamping effect of the same select transistor 4 become effective.

The values of $V_{Teff}$ and $V_0$ may be calculated from the point of work plots of FIG. 3 or determined experimentally on a reference cell, from the drain current versus control gate voltage characteristic without and with select transistor clamp.

Figure 6:
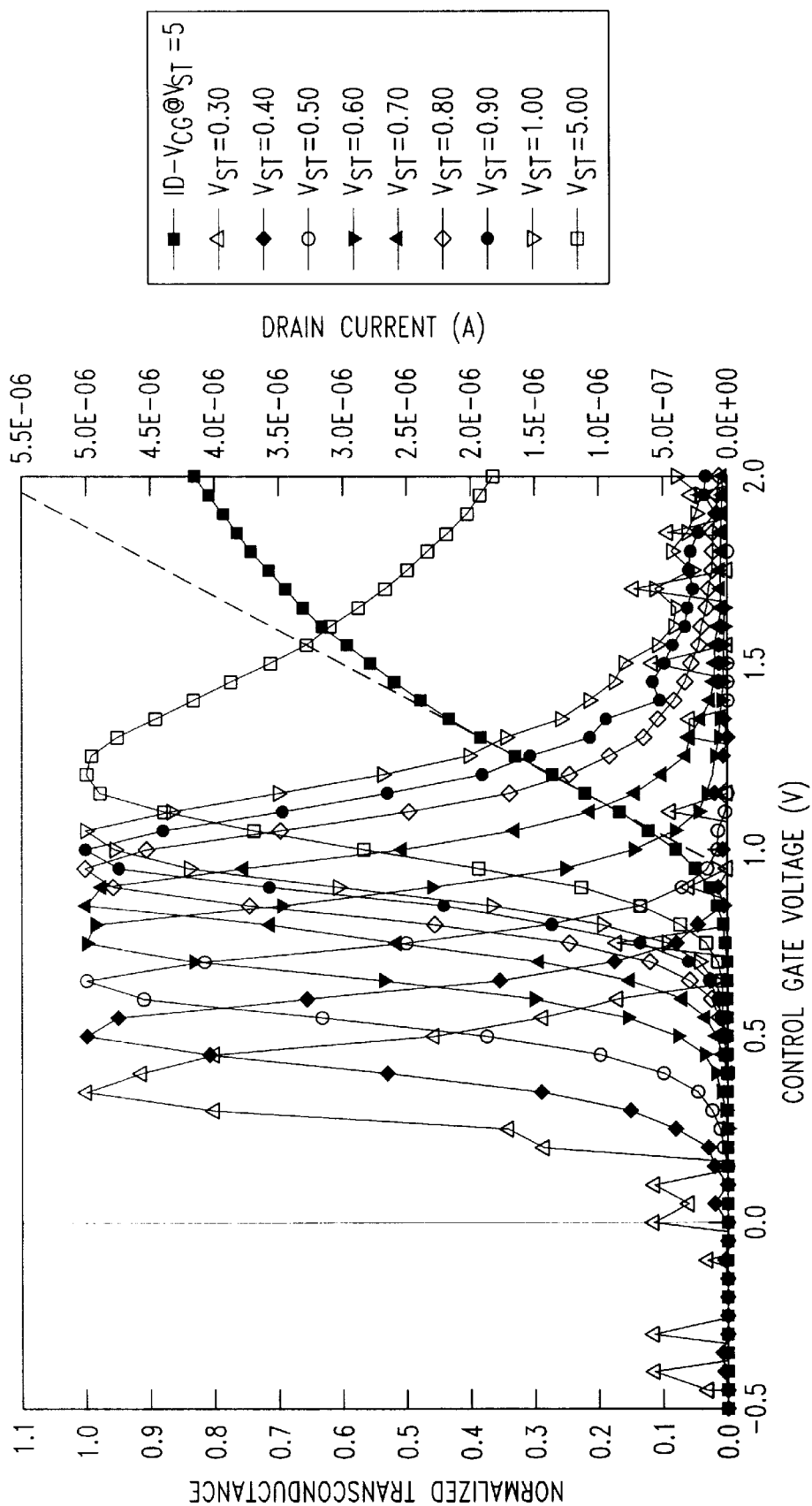

FIG. 6 shows the plots of normalized transconductance $g_m$ versus the control gate voltage $V_{CG}$ for different select voltages $V_{ST}$. As may be seen, the select voltages $V_{ST}$ has a strong influence on the effective threshold voltage $V_{Teff}$ that, conveniently, may be defined as the control gate voltage corresponding to the maximum of the curves.

Figure 7:
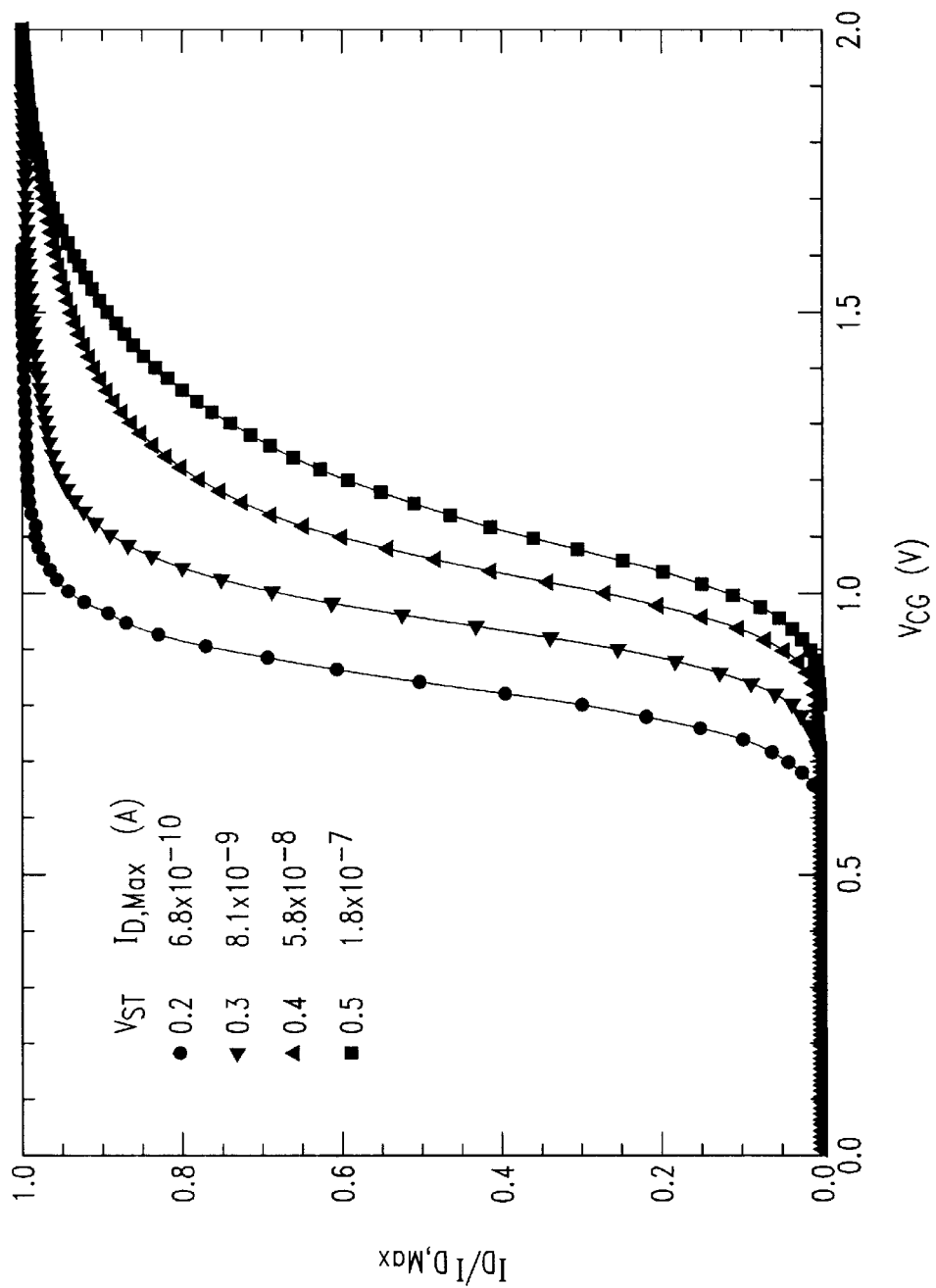

As visible in particular from FIG. 7, showing plots of normalized drain current $I_D/I_{D,MAX}$ versus control gate voltage $V_{CG}$, the rise width $\Delta V$ of the step (calculated for example as $\Delta V=V_{CG1}-V_{CG2}$, wherein $V_{CG1}$ is the control gate voltage $V_{CG}$ corresponding to the 90% of the maximum drain current $I_{SAT}$ and $V_{CG2}$ is the control gate voltage corresponding to the 10% of $I_{SAT}$) increases along with the select voltage $V_{ST}$ and has a value of few mV; thus the rise width $\Delta V$ will be neglected in the following discussion.

As indicated, clamping of the drain current $I_D$ is due to the point of work of the select transistor 4; indeed, FIG. 3, an increase of the control gate voltage $V_{CG}$ would cause an increase in the drain current $I_D$ which in turn tends to cause an increase in the voltage drop $V_D-V_X$ across the select transistor 4; thus the intermediate voltage $V_X$ tends to decrease, causing a reduction in the drain current $I_D$; thereby resulting in a constant value current.

Since both the rise width and the maximum drain current $I_{SAT}$ increase with select voltage $V_{ST}$, it is advantageous to bias the select transistor 4 at a voltage causing the minimum cell current detectable by the ammeter (dependence of the select voltage on the ammeter sensitivity), so as to increase the resolution of the single stress steps and to avoid excessive current problems (causing the above discussed clamping of the total current due to the series resistance) when a high number of memory cells 2 are on. In practice, the chosen value of select voltage $V_{ST}$ is next to the threshold voltage $V_{TH,ssl}$ of the select transistor 4 (wherein the term "next" indicates a value of between $V_{TH,sel}-1.5V$ and $V_{TH,sel}+0.5$ V; preferably a value of between $V_{TH,sel}$ and $V_{TH,sel}-0.5$ V).

The total current $I_{D,TOT}(V_{CG})$ of the test structure 1, after clamping, is given by the sum of the N elementary contributions $I_D(V_{CG})$ of the single memory cells at a given control gate voltage $V_{CG}$, that is:

$$I_{D,TOT}(V_{CG})=\Sigma I_D(V_{CG})$$

Therefore, by limiting the current of each memory cell 2 to about 1–10 nm (which may be done easily), for a 1M-cell array, the total current $I_{D,TOT}(V_{CG})$ does not exceed 1–10 nA, which is sufficiently low to avoid the current clamping problem of the prior art test structure.

Neglecting the rise width of the current step with respect to the total width of the distribution of threshold voltage in the test structure 1 (thus assuming that the memory cells 2 turn on suddenly to the maximum current $I_D(V_{CG})$), it is possible to obtain the distribution of the threshold voltage $V_T$ in the test structure 1, since the total current at any given control gate voltage $V_{CG}$ is proportional to the number of cells with $V_T<V_{CG}$.

In particular, it is possible to demonstrate that the total current $I_{D,TOT}(V_{CG})$ of the test structure 1 is given by the convolution of a reference cell drain current $I_D(V_{CG})$ with the threshold voltage distribution $D(V_{CG})$ in the test structure:

$$I_{D,TOT}(V_{CG})=I_D(V_{CG}) \cdot D(V_{CG}) \quad (1)$$

Due to the convolution and derivative linearity properties, a similar relation holds for the test structure transconductance $g_{m,TOT}(V_{CG})$:

$$g_{m,TOT}(V_{CG})=g_m(V_{CG}) \cdot D(V_{CG}) \quad (2)$$

The convolution in equations (1) and (2) can be analytically solved by introducing some approximations in the expression for the single cell and test structure transconductance as gaussian curves, and by fitting these curves on a reference cell, for which the drain current $I_D(V_{CG})$ and transconductance $g_m(V_{CG})$ have been determined.

Figure 8:
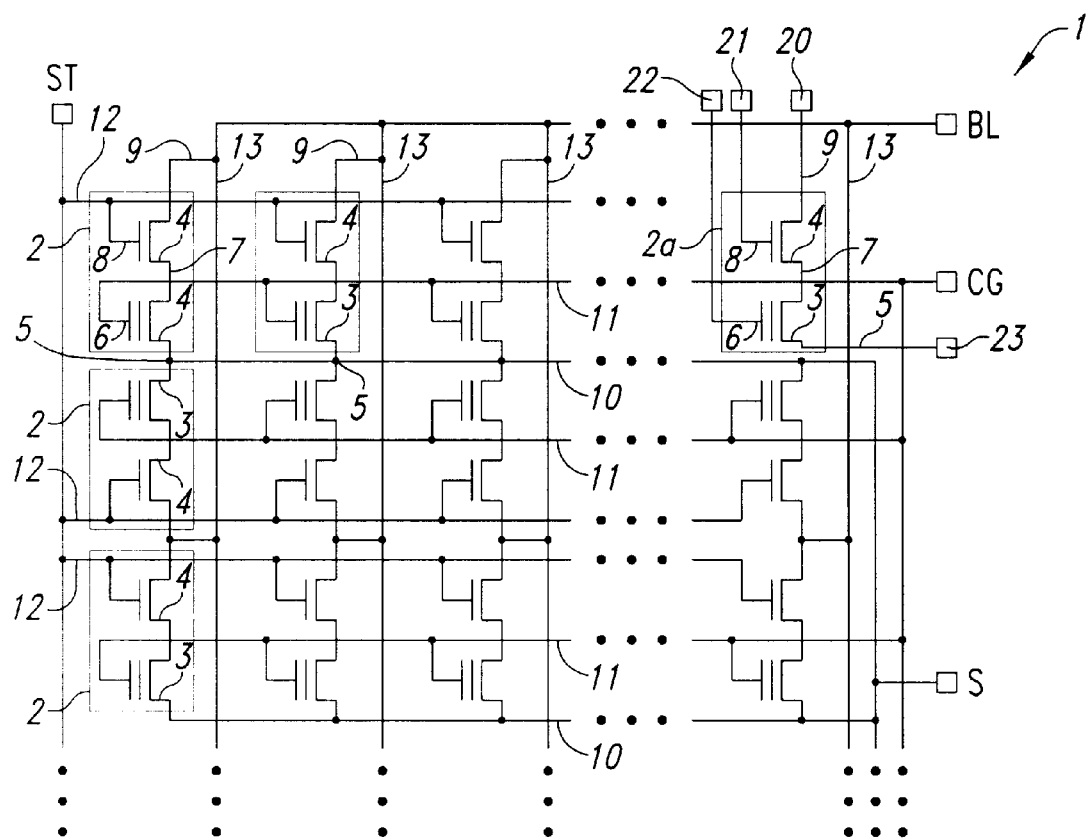
FIG. 8 is a circuit diagram of a fourth embodiment of the test device according to the invention.

To this end, a test structure as shown in FIG. 8 may be used, wherein all memory cells 2 but one are connected in parallel, and a reference cell 2a is separately accessible through a reference drain pad 20, a reference select transistor pad 21, a reference control gate pad 22. Reference source terminal may be separated, as shown at 23, or connected to the source pad S. In FIG. 8, the memory cell 2 has the configuration of the test structure of FIG. 1a, shown in detail in FIG. 2a.

Using the gaussian approximation for the reference cell transconductance $g_m(V_{CG})$, the latter may be written as:

$$g_m(V_{CG}) = \frac{1}{\sqrt{2\pi}\,\sigma_C}\exp\left(-\frac{(V_{CG}-V_{Teff})^2}{2\sigma_C^2}\right) \quad (3)$$

wherein $V_{Teff}=V_T-V_0$, as above discussed, and $\sigma_C$ is a fitting parameter and is used to best fit the experimental curve measured on the reference cell 2a of FIG. 8 with the gaussian curve. In particular, the lower is the select voltage $V_{ST}$ and the smaller is the control gate voltage $V_{CG}$ range for which the drain current is not clamped, the smaller is the fitting parameter $\sigma_C$.

It is further assumed that the threshold voltage distribution $D(V_{CG})$ is given by:

$$D(V_{CG}) = \frac{N}{\sqrt{2\pi}\,\sigma_D}\exp\left(-\frac{(V_{CG}-\Delta V_{TO})^2}{2\sigma_C^2}\right) \quad (4)$$

where $\Delta V_{TO}=V_{TO}-V_T$ is the shift of the distribution barycenter $V_{TO}$ with respect to the reference cell 2a (extrapolated) threshold voltage and $\sigma_D$ is the standard deviation of the distribution.

$\Delta V_{TO}$ depends only on the choice of the memory transistor 3 of reference cell 2a and not on the bias of the select transistor 4.

Under these assumptions, the convolution can be solved analytically and the test structure transconductance $g_{m,TOT}$ with select transistor clamp is also gaussian and is given by:

$$g_{m,TOT}(V_{CG}) = \frac{N}{\sqrt{2\pi}\Sigma} \exp\left(-\frac{(V_{CG} - V_{Teff} - \Delta V_{T0})^2}{2\Sigma^2}\right) \quad (5)$$

where $\Sigma^2 = \sigma^2_C + \sigma^2_D$ and the other symbols have the meaning defined above.

By best fitting the reference cell transconductance $g_m(V_{CG})$ and the test structure transconductance $g_{m,TOT}(V_{CG})$ using the above equation, it is possible to obtain $\sigma_C$, $V_{Teff}$, $\Sigma$ and $\Delta V_{TO}$ and therefore infer the distribution parameters $V_{TO}$ and $\sigma_D$. Thus the distribution according to equation (4) may be obtained.

The threshold voltage distribution may also be obtained by means of known numerical method applied to equation 1 or 2, without the need of any approximation. The above is also valid for the test structures of FIGS. 1b and 1c, with a single reference cell separately addressable.

The test structure 1 is particularly useful to determine the distribution of the threshold voltages of the memory cells 2 using the Fowler-Nordheim tunneling both for erasing and for writing, since in this case it is possible to program (write and erase) the entire test structure in parallel. The required current is not high and thus the typical problems affecting cells written by hot electron injection do not arise. It is thus possible to measure the distribution of virgin cells, of cells subject to a preset stress (not representing the working conditions of the memory array) and also of cells subjected to a preset number of writing and erasing cycles, in a completely equivalent way to the standard operation of the memory array.

Figure 9A:
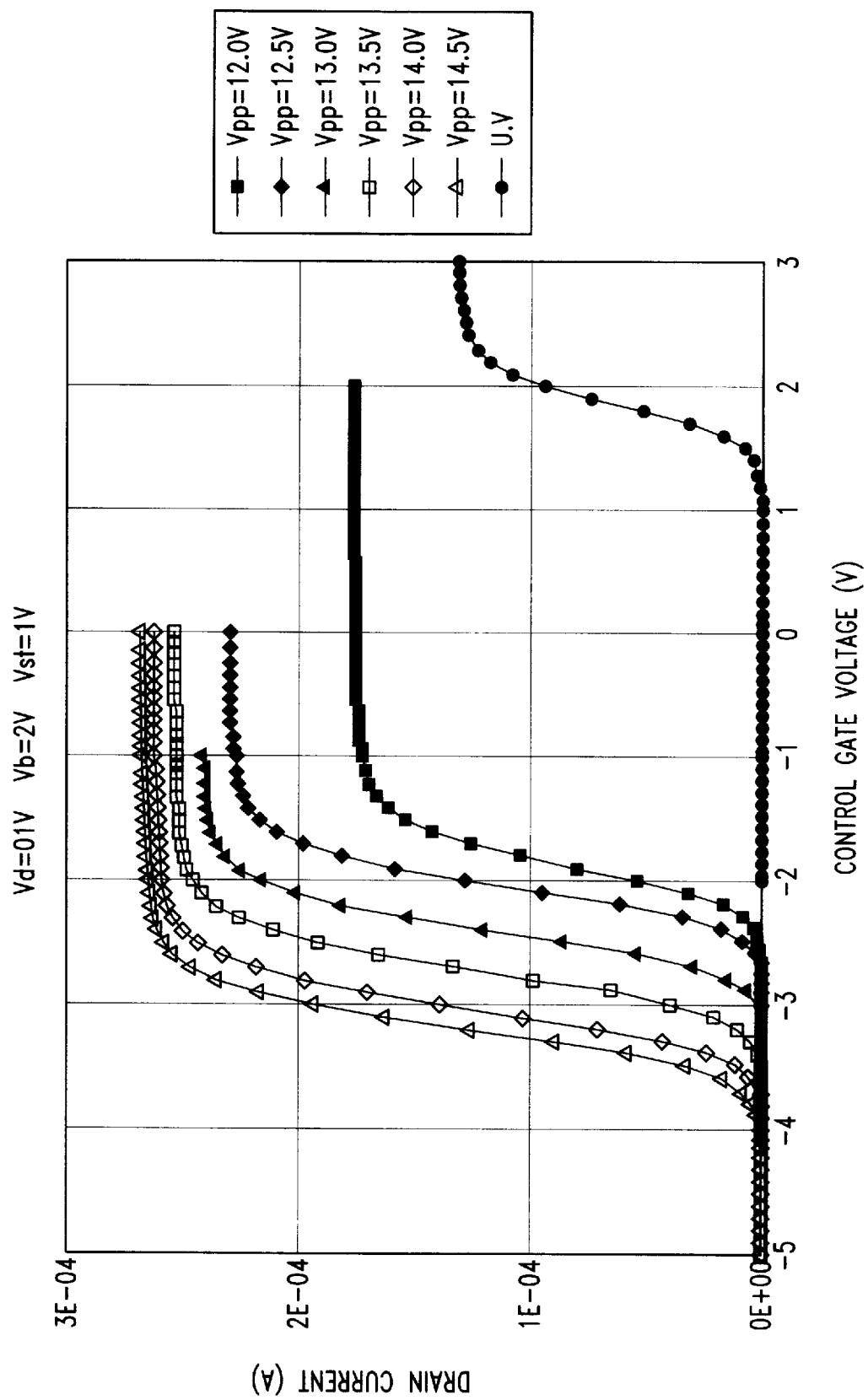
FIG. 9a shows plots of the drain current versus control gate voltage of the array of FIG. 1a, after programming pulses of different amplitude applied to the drain terminal.
Figure 9B:
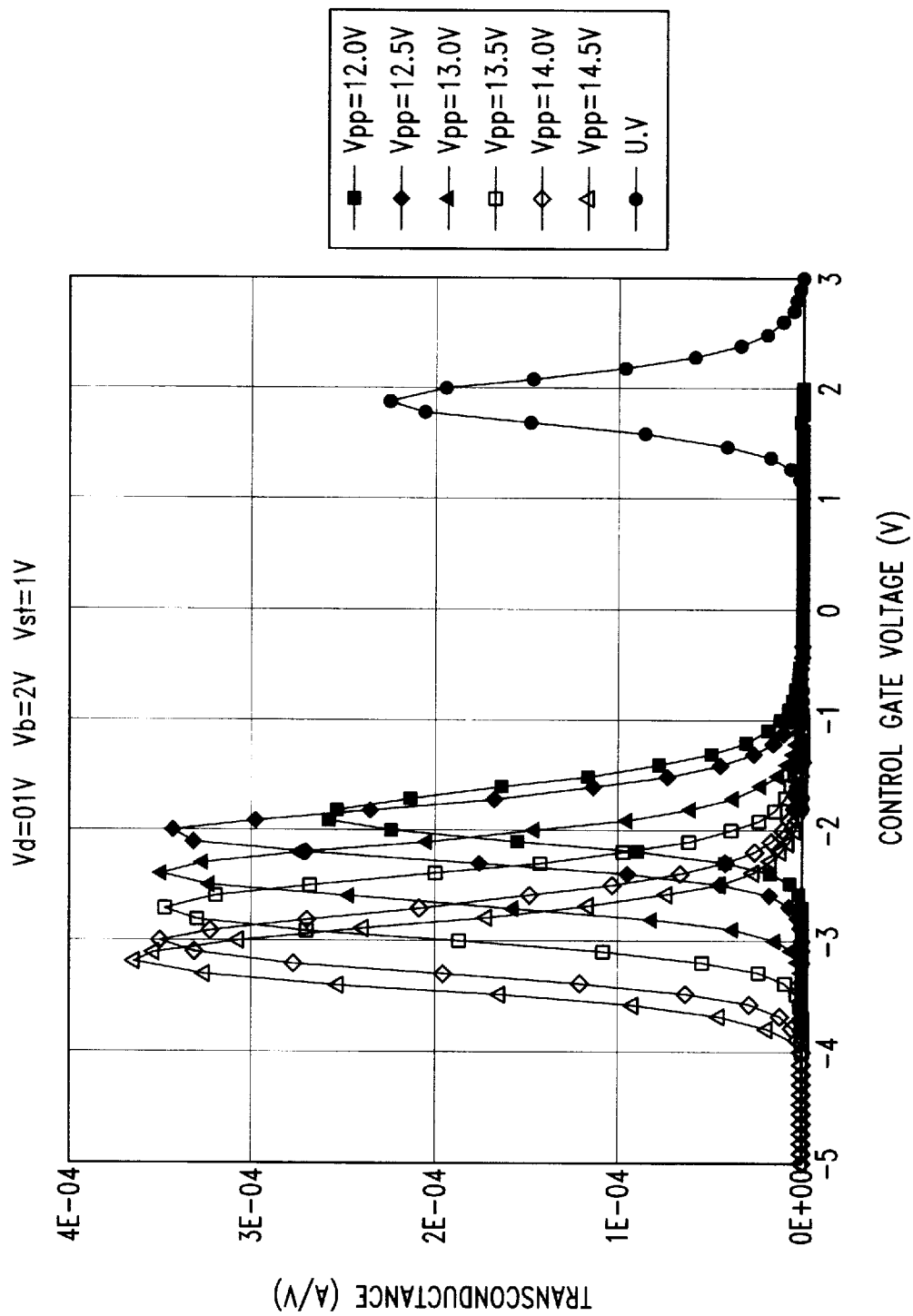
Figure 10A:
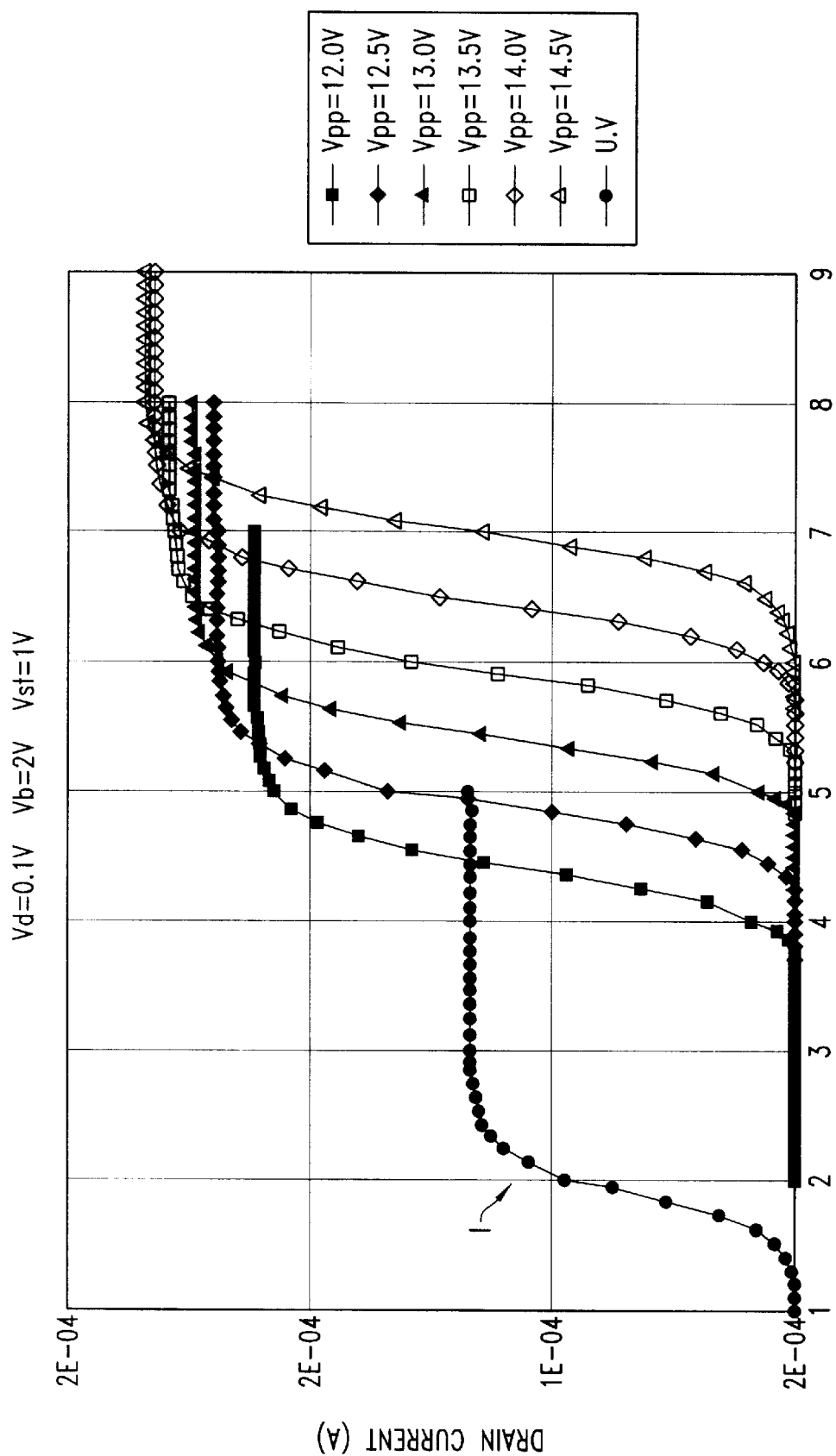
FIG. 10a shows plots of the drain current versus control gate voltage of the array of FIG. 1a, after erasing pulses of different amplitude applied to the gate terminal.
Figure 10B:
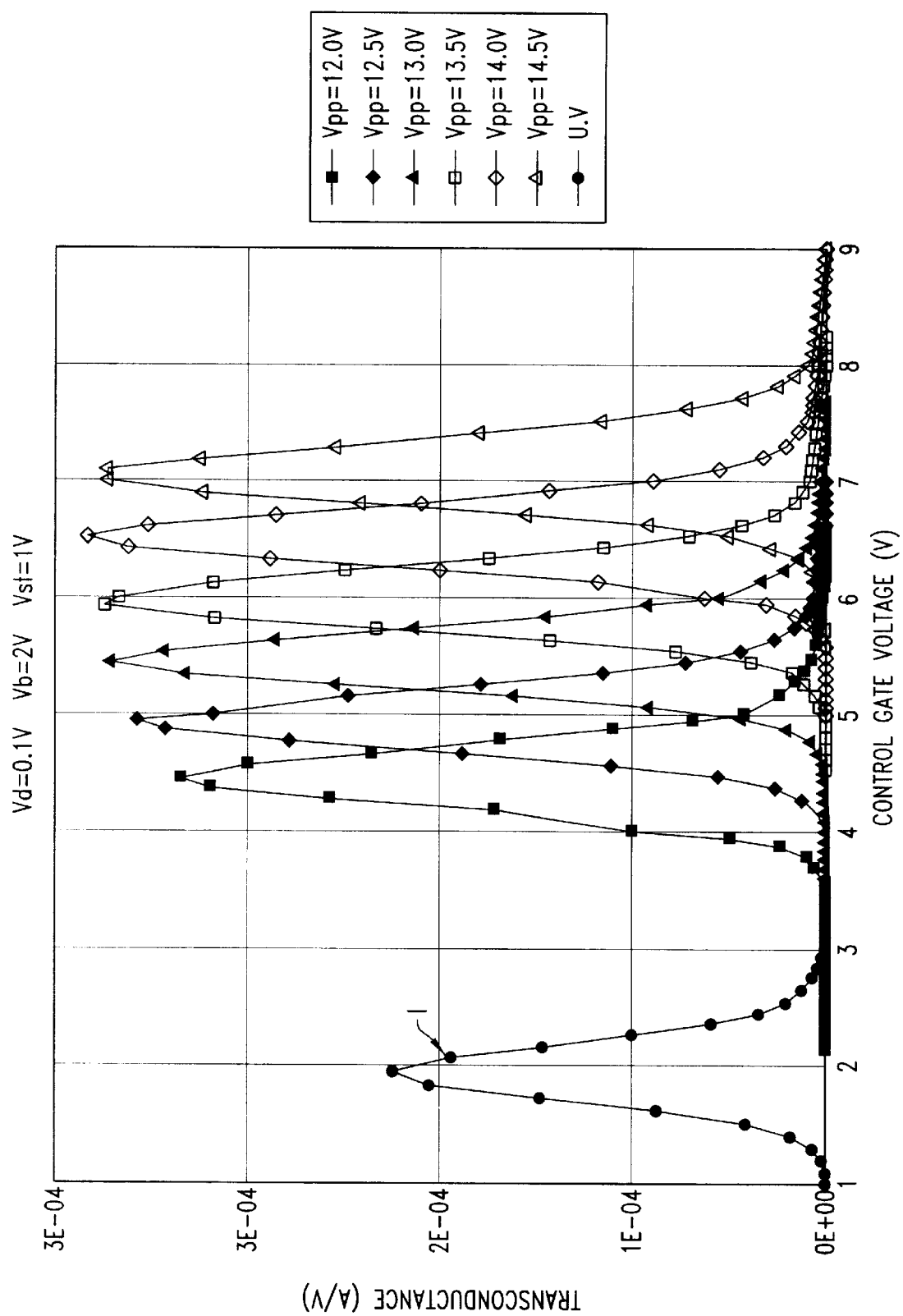
Figure 11A:
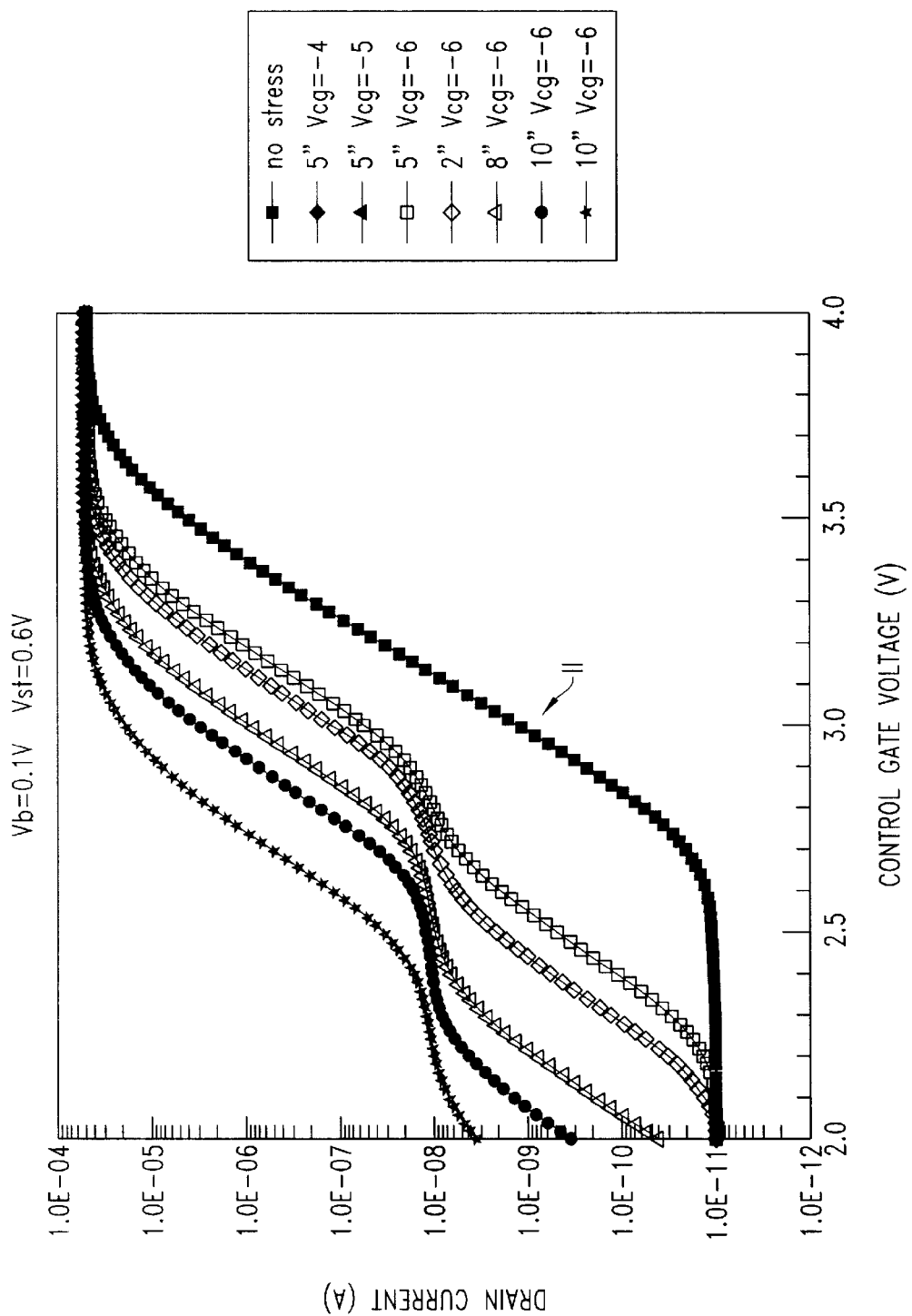
FIG. 11a shows plots of the drain current versus control gate voltage after repeated negative stresses of a test structure including defective cells.
Figure 11B:
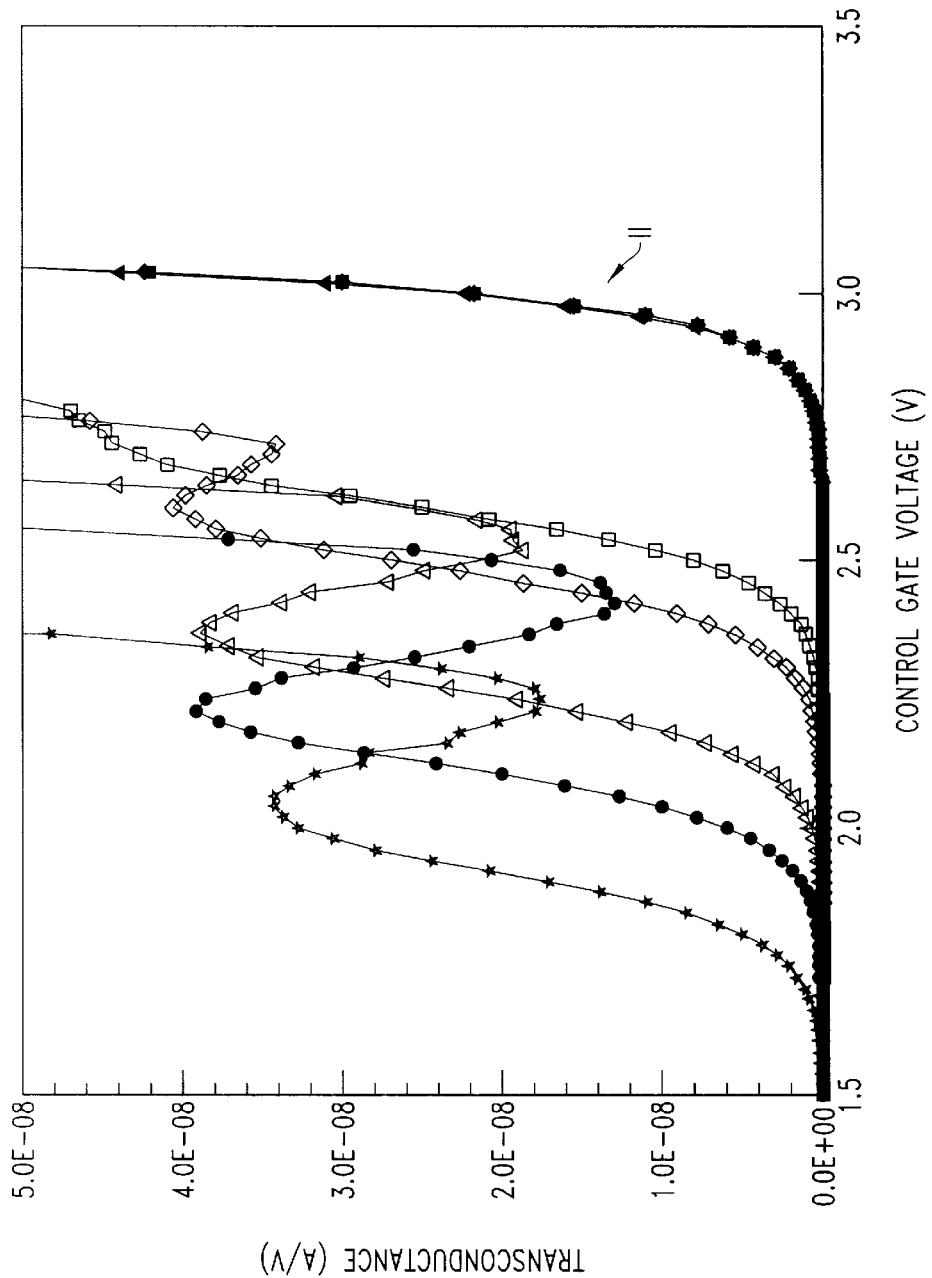
FIG. 11b plots of the transconductance obtained from the drain current versus control gate voltage plots of FIG. 11a in an enlarged scale.

For example, FIGS. 9a and 9b show the variation of the drain current $I_D$ and, respectively, of the transconductance $g_m$ after write pulses of different positive amplitudes applied to the drain terminal of the memory transistor 3 causing extraction of electrons from the floating gate region 56 of the memory transistor 3 by Fowler-Nordheim tunneling. FIGS. 10a and 10b show the variation of the drain current $I_D$ and, respectively, of the transconductance $g_m$ after erase pulses with different positive amplitudes applied to the control gate terminal 6 of the memory transistor 3 causing injection of electrons in the floating gate region 56 of the memory transistor 3 by Fowler-Nordheim tunneling. FIG. 11a shows the variation of the drain current $I_D$ analogously to FIG. 9a for a test structure 1 having a defective memory cell. FIG. 11b shows plots of the transconductance obtained from the plots of FIG. 11a, in an enlarged scale, pointing out the effect of the defective memory cell. In FIGS. 9a, 9b, 10a, 10b the curves I refer to a test memory 1a including virgin memory cells (UV erased); in FIGS. 11a and 11b the curve II refers to a test structure 1a before control gate stress.

Therefore, the test method is particularly simple and very sensitive: as regards detection of the influence of the single memory cell on the left side of the threshold distribution, the sensitivity is only limited by the current measuring instrument and the select voltage $V_{ST}$ (i.e., simple cell saturation current); and, on the right side of the threshold distribution, by precision of the current measuring instrument (typically, of the order of 0.001 to 0.01%, corresponding to 10 to 100 cells in case of a 1M cells array).

The present test structure allows different portions of the test structure to be checked separately, by providing a number of separate pads which allow separate addressing of these portions of the test structure. For example, FIG. 12 shows a test structure 25 with separate addressing of the odd/even rows; here the control gate lines 11a of odd rows are connected to an odd control gate pad 30a; the control gate lines 11b of even rows are connected to an even control gate pad 30b; the select lines 12a of odd rows are connected to an odd select transistor pad 31a; the select lines 12b of even rows are connected to an even select transistor pad 31b; the bit lines 13 are connected to a same bit line pad BL and the source lines 10 are connected to a same source pad S.

Figure 13:
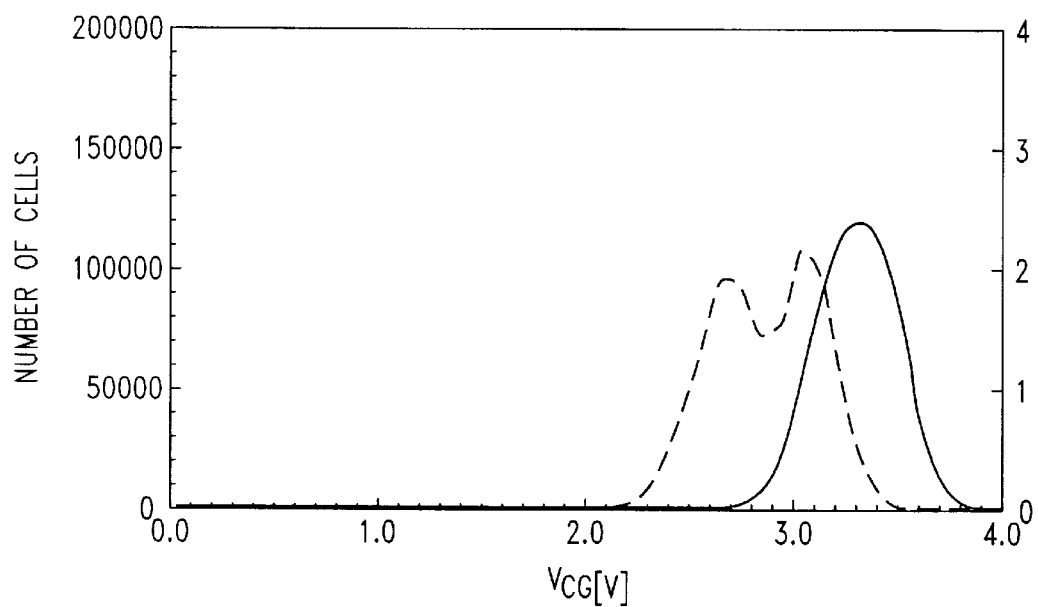
FIG. 13 shows the distribution of the threshold voltages of the test structure of FIG. 12 for a symmetric and an asymmetric test structure.

Test structure 25 may point out any even/odd row asymmetry, as shown in FIG. 13, wherein the dashed threshold distribution curve on the right is double-peaked, as compared with the continuous line plot, relative to a symmetric test structure.

Figure 12:
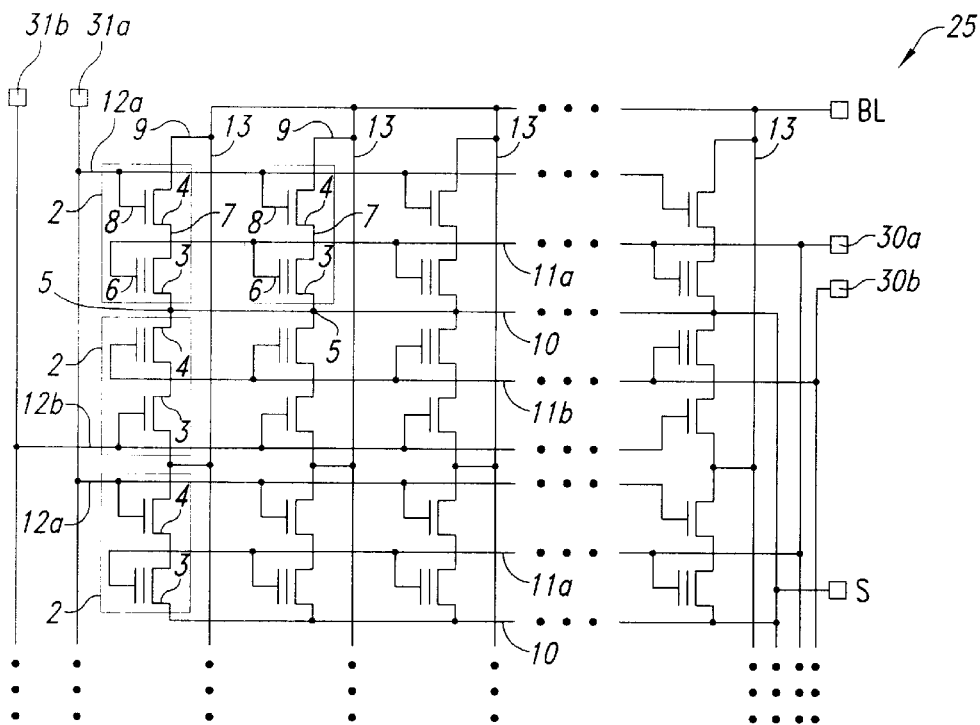
FIG. 12 is a circuit diagram of a fifth embodiment of the test device according to the invention.

According to a different embodiment, and analogously to the solution of FIG. 1b, also test structure 25 of FIG. 12 may have the drain terminals of the memory transistors 3 connected to the bit lines 13 and the source terminals 15 of the select transistors 4 connected to the source lines 10. In the alternative, and analogously to the solution of FIG. 1c, the select transistors 4 may be shared by a group of memory cells 2.

Figure 14:
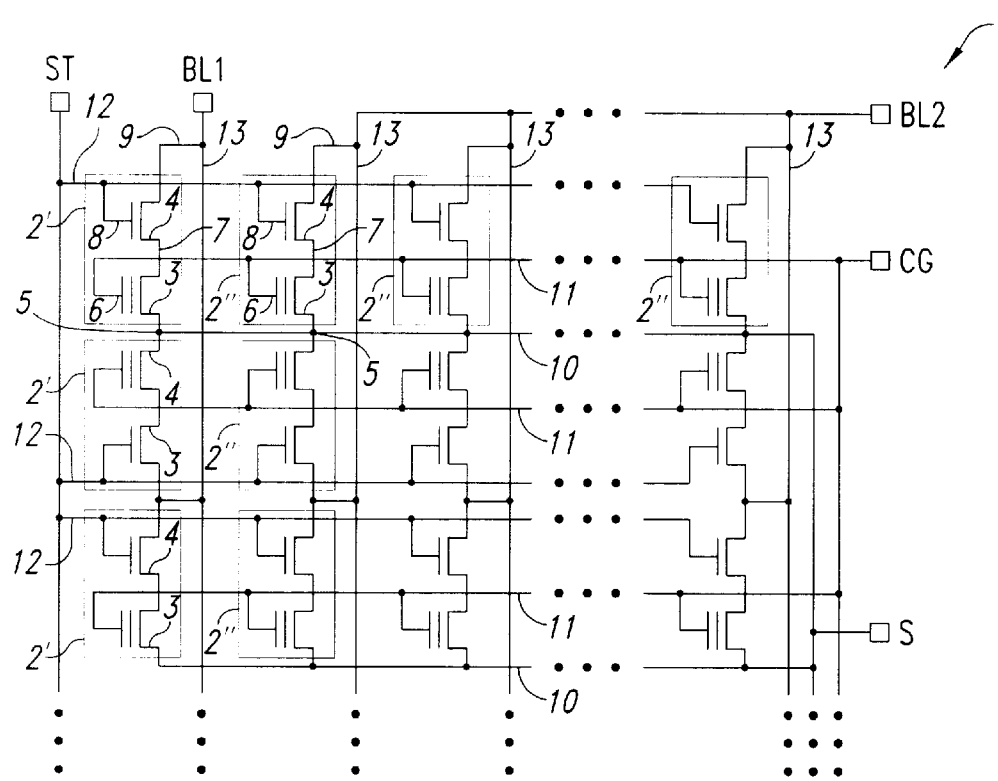
FIG. 14 is a circuit diagram of a sixth embodiment of the test device according to the invention.

In the alternative, all memory cells in a first region may be connected to each other and all memory cells in a second region may be connected to each other. For example, the test structure according to FIG. 14, has byte border cells 2' connected to a first bit line pad BL1, and all the remaining byte memory cells 2" connected to a second bit line pad BL2. All memory cells 2' and 2" are further connected to the same source pad S, the same control gate pad CG to the same select transistor pad. Thereby any difference between border memory cells and the remaining cells may be pointed out.

The test structure allows modulation of the maximum current of the memory cells by modifying the select voltage $V_{ST}$, and thus application of different select voltages $V_{ST}$ for studying different portions of the threshold voltage distribution. For example, when observing the right side of the threshold distribution, characterized by high control gate voltages $V_{CG}$, it is possible to set low select voltages $V_{ST}$ so as to reduce the maximum drain current $I_{SAT}$ and avoid series resistance problems.

Figures 15, 16:
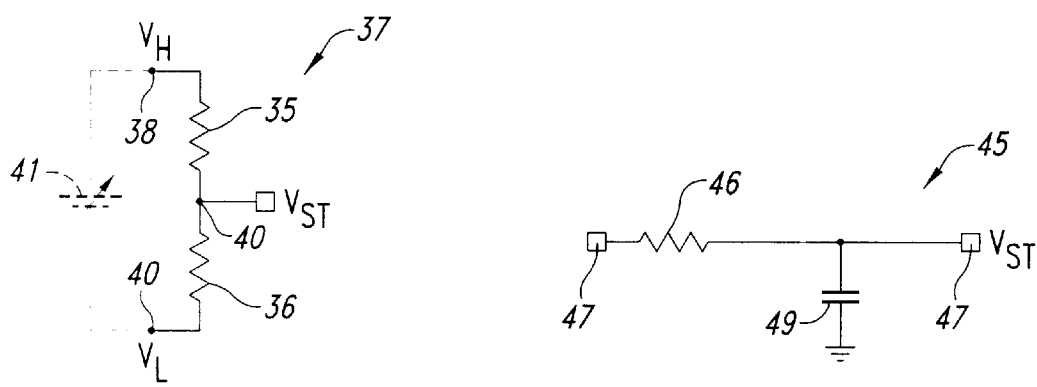
FIG. 15 shows a schematic diagram of a circuit to be connected to the test structure according to the invention.
FIG. 16 shows a schematic diagram of another circuit to be connected to the test structure according to the invention.

Since the point of work is very sensitive to the select voltage $V_{ST}$ and to any voltage source generates a noise superimposed to the desired signal, conveniently the select voltage $V_{ST}$ may be supplied using a resistive voltage divider as shown in FIG. 15. The resistive voltage divider 37 of FIG. 15 comprises two resistors 35, 36 connected in series between two nodes 38, 39 set at a high voltage $V_H$ and, respectively, a low voltage $V_L$. The resistors 35, 36, having a resistance of $R_1$ respectively $R_2$, form an intermediate node or tap 40 connected to the select transistor pad ST (FIGS. 1a, 1b, 1c, 8) or 31a, 31b (FIG. 12) to supply select voltage $V_{ST}$:

$$ST = (V_H - V_L)R_2/(R_1 + R_2)$$

The resistive voltage divider 37 of FIG. 15 may be integrated on the same wafer as the test structure 1 and has the aim of reducing the noise of a voltage source 41 (shown in dashed lines between nodes 38, 39) by the resistive ratio $R_2/(R_1+R_2)$.

According to an aspect of the invention, a lowpass filter may be provided for cutting off the high frequency components of the select voltage $V_{ST}$, generated by the voltage source 41. In FIG. 16 a lowpass filter 45 has a resistor 46 connected between an input terminal 47 (e.g., a pad) and an output terminal 48, supplying select voltage $V_{ST}$. The input terminal 47 is connected to a voltage source (not shown); a capacitor 49 is connected between the output terminal 48 and ground.

The lowpass filter 45 may be combined with the resistive voltage divider 37 of FIG. 15; in this case, capacitor 49 can be connected to the intermediate node 40 of FIG. 15.

The test structure 1 may be used to evaluate the quality of the tunnel oxide and interpoly dielectric regions as taught in the above discussed U.S. Pat. Nos. 5,515,318, 5,604,699, 5,712,816 and 5,793,675, that is by determining two different stress voltages $V_{CG}$ causing a shift to the distribution tail at low voltage and the shift due to the intrinsic behavior of the memory cells and comparing the two stress voltages to detect the presence of any defective memory cell.

According to another test method, a more direct detection of the quality and features of the dielectric regions of the memory cells 2 may be obtained.

According to the latter test method, the test structure is subjected, in sequence to the following steps:

1.) UV erasing;
2.) integrity test for the select transistor;
3.) leakage test for the control gate;
4.) source and drain leakage measure;
5.) measuring of the threshold distribution $V_T$ (e.g., using equation (4) and the above described method);
6.) biasing the control gate terminals 6 (FIGS. 1a, 1b, 1c, 8, 12) with a positive control gate voltage $V_{CG}$ to obtain electron injection in the floating gate of the memory transistors 3 (program pulse or simple positive voltage stress);
7.) measure of the threshold distribution $V_T$;
8.) biasing the control gate terminals 6 with a negative control gate voltage $V_{CG}$ with simultaneous and optional drain biasing to obtain electron extraction from the floating gate of the memory transistors 3 (program pulse or simple negative voltage stress); and
9.) measure of the threshold distribution $V_T$.

As an alternative to step 8, the memory transistors 3 may be stressed by conventional write pulses, applying a positive voltage to the drain terminals 7 through select transistor 3 (positive drain voltage $V_D$ and high select voltage $V_{ST}$) with grounded control gate terminal 6.

Using suitable known statistical methods, from the measures according to steps 5, 7 and 9, the following information may be obtained:

average value of the threshold voltage $V_T$;
standard deviation of the threshold voltage distribution;
$V_T$–$V_{T,min}$ (distance between the lowest threshold voltage and the typical value);
$V_{T,MAX}$–$V_T$ (distance between the highest threshold voltage and the typical value);
number of memory cells with threshold voltage comprised in a predetermined voltage range.

According to a different solution, steps 5–9 may be replaced by iterative steps of applying a stress voltage of increasing amplitude to the control gate terminal and then measuring the characteristic of the test structure and stopping the iterative procedure when a specific condition is satisfied.

For example at each stressing step, the control gate voltage may be increased by e.g., 1 V beginning from a preset value (e.g., 0 V) and the positive voltage stressing step is ended when the threshold voltage of most resistant memory cell (last cell to modify its threshold after applying the stress voltage), or of half of the memory cells or the most sensitive memory cell (first memory cell to modify its threshold after applying the stress voltage) is changed by a fixed amount (e.g., 0.2 or 0.5 V). For example, the first case (check of the most resistant memory cell) may be obtained by measuring the drain current of the test structure when all the cells are surely conductive, dividing the measured drain current by the number of memory cells to obtain the current contribution of the single memory cell and gradually reducing the control gate voltage until a current reduction equal to the previously obtained current contribute is detected.

Thereafter, a negative step-wise stress application and successive characteristic measuring may be carried out, by applying iteratively a control gate voltage of negative sign and increasing absolute value and measuring the characteristics of the test structure.

The application of a positive control gate voltage allows detecting of electron injection from the substrate to the floating gate, in case of defective tunnel oxide of one or some memory cells. In this case, the defective tunnel oxide allows the passage of the electrons for control gate values lower than the value causing tunneling in non-defective cells (intrinsic cells), causing an increase of the threshold voltage of the defective memory cells only.

Analogously, the application of a negative control gate voltage allows detecting of electron injection from the control gate to the floating gate, in case of defective interpoly dielectric region of one or some memory cells. In this case, the defective interpoly dielectric region allows the passage of the electrons for control gate values lower than the value causing tunneling in intrinsic memory cells, causing an increase of the threshold voltage of the defective memory cells. Of course, if the negative stress is repeated, as soon as the stress control gate reaches the tunnel causing value, a reduction of the threshold voltage for all the cells 2 of the test structure 1 (shift of the threshold voltage distribution) may be detected.

In case of a test structure having defective tunnel and interpoly oxide regions, in view of the different depth of the two oxides, it is possible to detect first the passage of electrons through the tunnel oxide and then through the interpoly dielectric region in both directions, depending on the direction of the applied electrical field. Therefore, the present test structure allows evaluation of the resistance of both dielectric layers of the memory cells in both electron passage directions. This is particularly important, in view of the fact the behavior of in particular the tunnel oxide as regards passage of charges is not symmetric.

The present test structure also allows study of the memory cells behavior after prolonged cycling.

The applied stress may be also of different nature, for example a temperature stress. Indeed, the present method and structure allows detection of the behavior of memory cells subject to thermal stresses, for example due to exposure in backing oven, and evaluation of both the left and right sides of the threshold distribution.

According to another aspect of the invention, the test method is carried out simultaneously or in succession for two test structures in a same wafer, one test structure being arranged in the wafer center, and the other test structure being arranged in the wafer border. Thereby, it is possible to carry out a different and aimed check of the test structure and to point out the existing disuniformities in the different parts of the wafer caused by the manufacturing process.

In particular, the invention is advantageously applicable to test EEPROM devices, formed by memory cells including a memory transistor and a select transistor and thus having the same configuration as the test structure. The test method is in this case particular meaningful, since the obtained test results may be directly applicable and are immediately related to the EEPROM device. The invention is in any case applicable also to other types of nonvolatile memories, such as flash-EEPROM, in which case the memory transistor 3 of the memory cell 2 has the same configuration and is formed with the same technology as the flash-EEPROM cell the oxide layers whereof are to be evaluated, so as to reproduce the electrical behavior thereof. In this case, the only difference between the cells in the operative memory devices formed in the same wafer to be evaluated and the cells in the test structure consists in the presence of the select transistor for limiting the current of the flash-EEPROM cell and allowing determination of the electrical characteristics thereof.

Finally, it is clear that numerous modifications and variations can be made to the memory and method described and illustrated herein, all of which falling within the scope of the invention, as defined in the attached claims.

What is claimed is:

1. A nonvolatile memory test structure, comprising a plurality of memory cells arranged in rows and columns, each memory cell comprising a memory transistor and a select transistor connected in series, each said memory cell having a first and a second current conduction terminal, a control gate terminal and a select gate terminal; a group of said memory cells being connected in parallel; the first current conduction terminals of the memory cells in the group being connected together and to a single first current conduction pad, the second current conduction terminals of the memory cells in the group being connected together and to a single second conduction pad; the control gate terminals of the memory cells in the group being connected together and to a single control gate pad; and the select gate terminals of the memory cells in the group being connected together and to a single select gate pad.

2. The nonvolatile memory test structure according to claim 1 wherein all of said memory cells are connected in parallel.

3. The nonvolatile memory test structure according to claim 2 wherein all but one of said memory cells are connected in parallel.

4. The nonvolatile memory test structure according to claim 1 wherein said rows comprise even rows and odd rows, the cells on the even rows being connected together in parallel and to said single first current conduction pad, to said single second current conduction pad, to an even control gate pad and to an even select gate pad, the cells on the odd rows being connected together in parallel and to said single first current conduction pad, to said single second current conduction pad, to an odd control gate pad and to an odd select gate pad.

5. The nonvolatile memory test structure according to claim 1 wherein then memory cells include a first group of cells and a second group of cells, the cells of said first group being connected together in parallel and to first control gate and select gate pads, and the cells of said second group being connected together in parallel and to second control gate and select gate pads.

6. The nonvolatile memory test structure according to claim 1 wherein said first current conduction terminal of each memory cell is a drain terminal of said select transistor of the memory cell, said second conduction terminal of the memory cell is a source terminal of said memory transistor of the memory cell, and a source terminal of said select transistor is connected to a drain terminal of said memory transistor.

7. The nonvolatile memory test structure according to claim 1 wherein said first current conduction terminal of each memory cell is a drain terminal of said memory transistor of the memory cell, said second conduction terminal of the memory cell is a source terminal of said select transistor of the memory cell, and a source terminal of said memory transistor is connected to a drain terminal of said select transistor.

8. The nonvolatile memory test structure according to claim 1 wherein a selected group of the memory cells shares a single select transistor and wherein said first current conduction terminal of each memory cell of the selected group is a drain terminal of said memory transistor of the memory cell, said second conduction terminal is a source terminal of said single select transistor, and said single select transistor has a drain terminal connected to source terminals of the memory cells of said selected group of memory cells.

9. The nonvolatile memory test structure according to claim 1 comprising a voltage source circuit including a resistive divider having a tap connected to said select gate pad.

10. The nonvolatile memory test structure according to claim 1 comprising a low-pass filter connected to a voltage input terminal and said select gate pad.

11. A nonvolatile memory test method for testing a test structure including a plurality of memory cells arranged in rows and columns, each memory cell comprising a memory transistor and a select transistor connected in series, each said memory cell having a first and a second current conduction terminals, a control gate terminal and a select gate terminal, the method comprising:

connecting first current conduction terminals of a group of said memory cells together and to a single first current conduction pad;

connecting second current conduction terminals of said group of memory cells together and to a single second conduction pad;

connecting control gate terminals of said group of memory cells together and to a single control gate pad;

connecting select gate terminals of said group of memory cells together and to a single select gate pad;

applying electric quantities to said single first and second current conduction pads, said single control gate pad and said single select gate pad; and measuring an electrical behavior of said memory cells after removing said electric quantities.

12. The method according to claim 11 wherein said select transistors of said group of memory cells each have a select transistor threshold voltage and said memory transistors of said group of memory cells each have a memory transistor threshold voltage, said step of applying electric quantities comprising applying a select gate voltage to said select gate having a value next to said select transistor threshold voltage; and said step of measuring an electrical behavior comprises determining a distribution of said memory transistor threshold voltages.

13. The method according to claim 11, comprising the steps of:

measuring a characteristic of said test structure;

applying a positive voltage to said control gate pad; and measuring again the characteristic of said test structure.

14. The method according to claim 13 wherein said memory transistors of said group of memory cells have respective memory transistor threshold voltages, said step of applying a positive voltage comprises applying a programming voltage pulse of such a value to inject electrons in a floating gate region of said memory transistors and to cause a shift in said memory transistor threshold voltages of said memory transistors of said group of memory cells; said step of measuring a characteristic comprises measuring a distribution of said memory transistor threshold voltages and said step of measuring again comprises determining a shift in said distribution.

15. The method according to claim 13 wherein said memory transistors of said group of memory cells have respective memory transistor threshold voltages, said step of applying a positive voltage comprising applying a stress voltage pulse of preset value; the method further comprising comparing the characteristics measured before and after applying said stress voltage pulse and repeating said steps of applying a voltage pulse and measuring again until the characteristics measured before and after applying said voltage pulse satisfy a preset condition.

16. The method according to claim 15 wherein said preset condition includes determining that a preset number of said memory transistors of said group of memory cells has changed their respective memory transistor threshold voltages by a preset quantity.

17. The method according to claim 13 wherein said step of applying a positive voltage comprises applying a positive voltage pulse such as to cause injection of electrons from a structure substrate.

18. The method according to claim 11, comprising the steps of:
measuring a characteristic of said test structure;
applying a negative voltage to said control gate pad; and
measuring again the characteristic of said test structure.

19. The method according to claim 18 wherein said memory transistors of said group of memory cells have respective memory transistor threshold voltages, said step of applying a negative voltage comprising applying a stress voltage pulse of preset value; the method further comprising comparing the characteristics measured before and after applying said stress voltage pulse and repeating said steps of applying a voltage pulse and measuring again until the characteristics measured before and after applying said voltage pulse satisfy a preset condition.

20. The method according to claim 19 wherein said preset condition includes determining that a preset number of said memory transistors of said group of memory cells has changed their respective memory transistor threshold voltages by a preset quantity.

21. The method according to claim 18 wherein said memory transistor of the group each has a control gate region and a floating gate region mutually insulated by an interpoly dielectric region, said step of applying a negative voltage comprising applying a negative voltage pulse such as to cause injection of electrons from said interpoly dielectric region of only defective ones of said memory cells of the group.

22. The method according to claim 11, comprising the steps of:
measuring a characteristic of said test structure;
applying a positive writing voltage to said control gate pad; and
measuring again the characteristic of said test structure.

23. The method according to claim 22 wherein each said memory transistors of said group of memory cells have respective memory transistor threshold voltages, said step of applying a positive writing voltage comprises applying a programming voltage pulse of such a value to extract electrons from a floating gate region of said memory transistors and to cause a shift in said memory transistor threshold voltages of said group of memory transistors; said step of measuring a characteristic comprises measuring a distribution of said memory transistor threshold voltages and said step of measuring again comprises determining a shift in said distribution.

24. The method according to claim 22 wherein said memory transistor has a control gate region and a floating gate region mutually insulated by an interpoly dielectric region said step of applying a positive write voltage comprising applying a voltage pulse such as to cause injection of electrons from said interpoly dielectric region of defective memory cells only.

25. A nonvolatile memory test structure, comprising:
a first memory cell having a first memory transistor and a first select transistor each with a control terminal and first and second conduction terminals, the second conduction terminal of the first memory transistor being connected to the first conduction terminal of the first select transistor; and
a second memory cell having a second memory transistor and a second select transistor each with a control terminal and first and second conduction terminals, the second conduction terminal of the second memory transistor being connected to the first conduction terminal of the second select transistor; wherein the first conduction terminals of the memory transistors are connected together and to a first conduction pad, the second conduction terminals of the select transistors are connected together and to a second conduction pad, the control terminals of the memory transistors are connected together and to a first control gate pad, and the control terminals of the select transistors are connected together and to a first select gate pad.

26. The nonvolatile memory test structure of claim 25, further comprising a third memory cell having a third memory transistor with a control terminal and first and second conduction terminals, the first conduction terminal of the third memory transistor being connected to the first conduction pad, the second conduction terminal of the third memory transistor being connected to the first conduction terminal of the first select transistor, and the control terminal of the third memory transistor being connected to the first control gate pad.

27. The nonvolatile memory test structure of claim 25 wherein the first the first and second memory cells are part of a first group of memory cells, the test structure further comprising a second group of memory cells each connected to the first and second conduction pads, a second control gate pad, and a second select gate pad.

28. The nonvolatile memory test structure of claim 25, further comprising a voltage source circuit including a resistive divider having a tap connected to the first select gate pad.

29. The nonvolatile memory test structure of claim 1, further comprising a low-pass filter connected to a voltage input terminal and the select gate pad.

* * * * *